Figure 1:
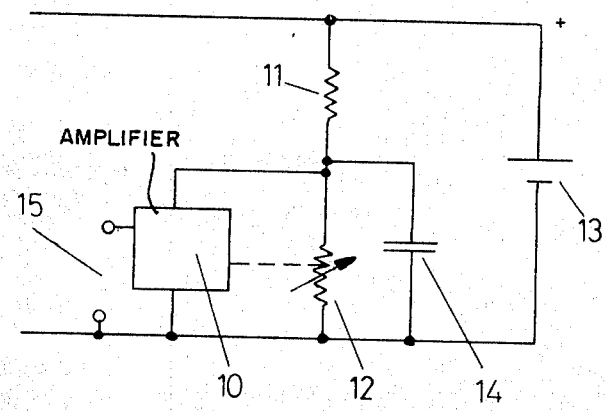

United States Patent [19]

Grundy et al.

[11] 4,001,694
[45] Jan. 4, 1977

[54] AUTOMATIC GAIN CONTROL CIRCUIT ARRANGEMENTS HAVING A PLURALITY OF STAGES OF AMPLIFICATION

[75] Inventors: David Latham Grundy, Saddleworth; John Thompson, Manchester, both of England

[73] Assignee: Ferranti Limited, Hollinwood, England

[22] Filed: May 27, 1975

[21] Appl. No.: 580,566

Related U.S. Application Data

[63] Continuation of Ser. No. 394,984, Sept. 7, 1973, abandoned.

[30] Foreign Application Priority Data

Sept. 13, 1972 United Kingdom ............ 42487/72

[52] U.S. Cl. ............................. 325/319; 325/409; 325/413; 330/29; 330/98; 330/139
[51] Int. Cl.² ......................................... H04B 1/16
[58] Field of Search .......... 325/319, 408, 409, 400, 325/411–413, 415; 330/29, 96, 98, 129, 139

[56] References Cited

UNITED STATES PATENTS

| | | | |
|---|---|---|---|
| 2,866,892 | 12/1958 | Barton | 325/408 |
| 3,029,340 | 4/1962 | Englund | 325/319 |
| 3,258,695 | 6/1966 | Brown et al. | 325/319 |

*Primary Examiner*—Robert L. Griffin
*Assistant Examiner*—Marc E. Bookbinder
*Attorney, Agent, or Firm*—Cameron, Kerkam, Sutton, Stowell & Stowell

[57] ABSTRACT

Automatic gain control is provided in a two stage amplifier in which the first stage has a signal voltage gain related to its supply voltage and the second, or output, stage comprises an output transistor. The load of the output stage comprises an earphone in series with the supply. The supply for the first stage is taken from the junction of the output transistor and the earphone such that the gain varies inversely with the output of the earphone. The amplifier stages may be formed as a monolithic integrated circuit and contained in the housing of the earphone.

7 Claims, 3 Drawing Figures

AUTOMATIC GAIN CONTROL CIRCUIT ARRANGEMENTS HAVING A PLURALITY OF STAGES OF AMPLIFICATION

This is a continuation of application Ser. No. 394,984, filed Sept. 7, 1973, now abandoned.

This invention relates to automatic gain control circuit arrangements having a plurality of stages of amplification.

Automatic gain control in such circuit arrangements usually takes the form of a feedback loop from the output of the final stage to a preceding stage, by which feedback loop the gain of the preceding stage is altered in dependence on the mean level of the output. Such loops are provided in addition to the normal signal paths and power supply paths and involve much interconnection between the stages of the amplifier.

It is an object of the present invention to provide an automatic gain control circuit arrangement having a plurality of stages of amplification.

According to the present invention an automatic gain control circuit arrangement having a plurality of stages of amplification comprises an amplifier stage having a signal voltage gain proportional to the magnitude of its supply voltage, a capacitor, in parallel with the power supply to the amplifier stage and capable of smoothing variations of the supply voltage, an output stage, coupled to the amplifier stage and a load impedance for the output stage including an output transducer, said load impedance being in series with the power supply to the output stage and at least a part of said load impedance being in series with the power supply to the amplifier stage.

The amplifier stage and the output stage may be formed as a monolithic semiconductor integrated circuit.

The circuit arrangement may comprise part of a radio receiver, wherein the amplifier stage is responsive to radio frequency signals and the output stage includes a signal detection means.

Figure 2:
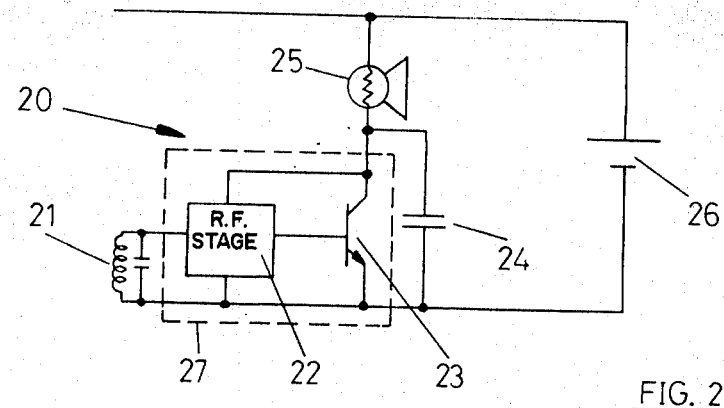
Figure 3:
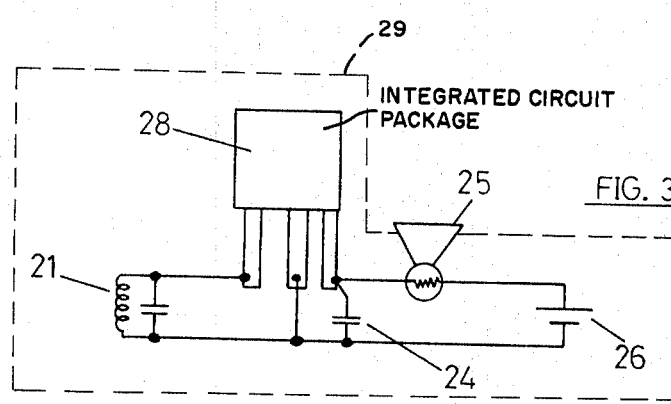

The invention will now be described by way of example with reference to the accompanying drawings in which:

FIG. 1 is a schematic circuit arrangement to illustrate the operation of the automatic gain control arrangement according to the present invention, FIG. 2 is a schematic circuit arrangement of a radio receiver incorporating automatic gain control according to the present invention, and FIG. 3 shows a schematic interconnection arrangement for the components of the radio receiver of FIG. 2.

Referring to FIG. 1, an amplifier stage 10 takes its power supply from the junction of two series connected resistance elements 11 and 12 supplied by a d.c. source 13. The resistance element 12 comprises a component whose resistance value varies inversely with the mean level of the output signal of the amplifier stage, and for this purpose the element 12 is shown coupled to amplifier stage by a broken line. The amplifier stage 10 has an input point 15, at which point it receives only small amplitude signals that are amplified without drawing a large current from the supply, and the signal voltage gain of the stage is related to the magnitude of its supply voltage. The stage may comprise one or more amplification elements each having an element gain directly proportional to the supply voltage such that the overall gain of the amplifier stage is related to the supply voltage level by the product of the individual element gains.

In operation an increase in the mean level of an output signal from the amplifier stage, caused by an increase in the mean level of an input signal, causes a reduction in the value of resistance offered by the element 12 and therefore an increase in the current flowing through it. The fraction of the source 13 voltage appearing across the resistance element 12 decreases, and the supply voltage to the amplifier stage 10 also decreases in magnitude.

As stated previously the signal voltage gain of the amplifier stage 10 is dependent on the magnitude of the supply voltage so that as the supply voltage falls, the gain of the stage decreases accordingly. The decrease in gain of the amplifier stage means that for a given input signal voltage level, the mean level of the voltage of the output signal must fall thus permitting the resistance value of the element 12 to rise again. The rise in resistance value of the element 12 results in an increase in the voltage across it and therefore in the supply to the amplifier stage. There is a subsequent rise in both the gain of the amplifier and in the mean level of the output signal of the amplifier resulting in a fall in the value of the resistance element 12. Thus for any mean voltage level of an input signal, a constant mean output signal voltage is obtained from the amplifier stage.

Referring now to FIG. 2 there is shown the circuit arrangement of a radio receiver 20. The receiver comprises a tuned circuit 21, a radio frequency (r.f.) amplifier stage 22, an output stage, comprising a common signal detector and audio frequency (a.f.) amplifier in the form of transistor 23, a and an output transducer 25, providing load for the amplifier 22, the circuit also includes a capacitor 24 shunting the supply terminals of the RF amplifier stage 22 and having a value chosen to pass the RF carrier frequency variations from the detected signal while not passing the AF modulation signals. The circuit arrangement is analogous to that of FIG. 1, the a.f. amplifier being equivalent to the resistance element 12 and the output transducer 25 being equivalent to the resistance element 11.

Operation is similar to that of the arrangement of FIG. 1, but the different operating frequency bands of the different amplifier stages are used to advantage. The first amplifier stage 22 is an R.F. amplifier. And if this consists of a plurality of elements, interstage coupling capacitors provide convenient limiting of amplification to R.F. signals in a simple otherwise wide-band amplifier. The transistor 23 has an amplitude modulated R.F. signal applied thereto and is arranged to detect this signal in known manner similar to a diode detector, but with a large output due to the gain of the transistor which thus also acts as an A.F. amplifier. The output signal from transistors 23, that is, the variation of the collector voltage (accompanied by current variation and the output transducer) consists of the A.F. signal plus R.F. carrier signals. The capacitor 24 bypasses the remaining R.F. signals to ground leaving only A.F. variations.

The supply to the R.F. amplifier stage obtained from the collector of the transistor 23 thus consists of a DC voltage from the battery 26, by way of the output transistor, varying with the A.F. output signal. The junction of the transducer 25 and collector of transistor 23 defines the level of the supply voltage to the R.F. amplifier 22. Therefore, when a received signal has large A.F. variations due to the signal strength, the level of the supply voltage to the R.F. amplifier modulated at the A.F. variations, is reduced, reducing the gain of this amplifier stage and the level of the signal amplified to the detector. The magnitude of the A.F. variations in the output transistor is contained within defined limits by the relationship between the percentage variation and supply voltage due to the A.F. signal and the change in gain due to this variation.

Automatic gain control as provided by the above arrangement has the advantage that a radio may be constructed without a manual volume control and may be made with all of the active components being provided in a monolithic semiconductor integrated circuit device.

Referring also to FIG. 3, the radio receiver of FIG. 2 is shown. All the active components, that is, the r.f. amplifier stage 22 and a.f. amplifier 23, indicated within the boundary 27 in FIG. 2, are contained in a three-pin package 28 and this is connected to the tuned circuit 21, R.F. filter capacitor 24, battery 26 and an earphone 25, designed to be worn in or near to an ear of a listener. The tuned circuit may be non-variable and tuned to a local station and the battery may be a mercury cell of small dimensions; these components, together with the capacitor 24 and package 28 may be mounted inside the casing of the earphone 25 diagrammatically represented in FIG. 3 by dash lines 29.

As described, the receiver produces an audio frequency output to an earphone. The transducer may be an actuator rod of the type used to control models or may be an ultrasonic transducer. The types, and frequencies, of the various signals are then chosen accordingly.

The circuit arrangement is not restricted to the form of a radio receiver and may be used, with a similar get-up for a hearing aid. In such a case (not shown) the r.f. amplifier 22 would be replaced by an a.f. voltage amplifier, drawing little current from the supply, and the input being provided by a microphone in place of the tuned circuit 21.

What we claim is:

1. An automatic gain control circuit arrangement having a plurality of stages of amplification comprising a first amplifier stage having input signal terminals connected to receive input signals and supply terminals connected to receive a supply voltage, a voltage divider connected across a power source, said voltage divider including a first impedance means and a second impedance means, said first and said second impedance means being serially connected, said second impedance means functioning as a second amplifier stage, a capacitor connected across said supply terminals, means for operatively connecting said second impedance means to said first amplifier stage to thereby provide a second stage of amplification for said input signal, said first impedance means providing a load impedance for said second stage, said second impedance means having an impedance value which varies inversely with the mean level of the output level of the first amplifier stage and being connected across said supply terminals of said first amplifier stage such that the signal voltage gain of said first stage is related to the magnitude of the supply voltage whereby a change in the mean level of an output signal from the first amplifier stage, caused by a change in the mean level of an input signal to said first stage, causes the value of said second impedance means to change and thereby cause a change in the total value of the series connected first and second impedance means such that the voltage applied to said supply terminals varies inversely with the mean level of the output signal from the first amplifier stage.

2. A circuit arrangement as claimed in claim 1 in which both the first amplifier stage and the second amplifier stage are a monolithic semiconductor integrated circuit package.

3. A circuit arrangement as claimed in claim 1 in which the second amplifier stage includes an audio frequency amplifier.

4. A circuit arrangement as claimed in claim 3 including an earpiece for direct insertion into an ear and wherein said first impedance means comprises an output transducer positioned within said earpiece and being operably connected to the output of said second amplifier stage.

5. A circuit arrangement as claimed in claim 4 in which the first and second stages of said circuit arrangement are disposed within said earpiece.

6. A circuit arrangement having a plurality of stages of amplification and arranged to receive a signal in a first frequency band modulated with a signal in a second frequency band, comprising a first amplifier stage connected to receive said modulated signal and having a signal output terminal and power supply terminals, said amplifier stage having, in said first frequency band, a signal gain related to the magnitude of an applied supply voltage, a capacitor connected across said power supply terminals for by-passing voltage variations in said first frequency band appearing at said supply terminals, detection means connected to the first amplifier stage and operable to demodulate said received signal, said detection means including an output amplifier stage operable to amplify said demodulated signal, said output amplifier stage being connected across the supply terminals of the first amplifier stage, and a load impedance, including an output transducer serially connected to the output amplifier stage, the junction of said load impedance and output amplifier stage being connected to a power supply terminal of the first amplifier and means for connecting said load impedance to a D.C. voltage source to supply an operating voltage to said output amplifier stage and said first amplifier stage by way of said load impedance.

7. A radio receiver comprising a tuned circuit operable to produce an output in response to reception of signals in a first frequency band modulated with signals in a second frequency band, a first amplifier stage connected to receive said modulated signal and having a signal output terminal and power supply terminals, said amplifier stage having, in said first frequency band, a signal gain related to the magnitude of an applied supply voltage, a capacitor connected across said power supply terminals and capable of by-passing voltage variations in said first frequency band appearing at said supply terminals, detection means connected to the first amplifier stage, said detection means being operable to demodulate said received signal, said detection means including an output amplifier stage operable to amplify said demodulated signal and having signal output terminals connected across the supply terminals of the first amplifier stage, and a load impedance including an output transducer for the output amplifier stage, said load impedance being serially connected to the signal output terminals of said output amplifier stage and means for connecting said load impedance to a D.C. voltage source to supply an operating voltage to said output amplifier stage and said first amplifier stage by way of said load impedance.

* * * * *